(12) United States Patent
Stansell et al.

(10) Patent No.: US 7,777,541 B1
(45) Date of Patent: Aug. 17, 2010

(54) CHARGE PUMP CIRCUIT AND METHOD FOR PHASE LOCKED LOOP

(75) Inventors: Galen E. Stansell, Kirkland, WA (US); Timothy Wright, Bellevue, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 31 days.

(21) Appl. No.: 11/701,215

(22) Filed: Feb. 1, 2007

Related U.S. Application Data

(60) Provisional application No. 60/764,589, filed on Feb. 1, 2006.

(51) Int. Cl.
*H03L 7/06* (2006.01)

(52) U.S. Cl. .................................. 327/157; 327/148

(58) Field of Classification Search ................. 327/157
See application file for complete search history.

(56) References Cited

U.S. PATENT DOCUMENTS

| | | | |
|---|---|---|---|
| 4,287,480 A | 9/1981 | Swift et al. | |
| 4,388,596 A | 6/1983 | Yamashita | |
| 4,668,922 A | 5/1987 | Crawford et al. | |
| 4,692,718 A | 9/1987 | Rosa et al. | |
| 4,812,783 A | 3/1989 | Honjo et al. | |
| 4,814,726 A | 3/1989 | Byrd et al. | |
| 4,817,199 A | 3/1989 | Wallraff | |
| 4,884,042 A | 11/1989 | Menon et al. | |
| 4,949,051 A | 8/1990 | Viola | |
| 4,972,442 A | 11/1990 | Steierman | |
| 4,980,899 A | 12/1990 | Troost et al. | |
| 5,008,635 A | 4/1991 | Hanke et al. | |
| 5,059,925 A | 10/1991 | Weisbloom | |
| 5,075,639 A | 12/1991 | Yaya | |
| 5,101,117 A | 3/1992 | Johnson et al. | |
| 5,119,043 A | 6/1992 | Brown et al. | |
| 5,121,086 A | 6/1992 | Srivastava | |
| 5,126,690 A | 6/1992 | Bui et al. | |
| 5,157,355 A | 10/1992 | Shikakura et al. | |
| 5,164,685 A | 11/1992 | Niemio | |
| 5,194,767 A * | 3/1993 | Chao | 326/70 |

(Continued)

OTHER PUBLICATIONS

U.S. Appl. No. 11/322,044, Not Published, Stiff, Jonathon.

(Continued)

*Primary Examiner*—Lincoln Donovan
*Assistant Examiner*—Daniel Rojas

(57) ABSTRACT

A charge pump circuit can include a pump-up circuit having a first disable switch coupled between a pump-up output node and a first power supply node that is enabled and then disabled in response to a source current path between the pump-up node and a second power supply node being disabled, and a source off switch coupled in series with the first disable switch that is enabled in response to the source current path being disabled. The charge pump circuit can also include a pump-down circuit having a second disable switch coupled between a pump-down output node and the second power supply node that is enabled and then disabled in response to a sink current path between the pump-down node and a first power supply node being disabled. A sink off switch can be coupled in series with the second disable switch that is enabled in response to the sink current path being disabled.

20 Claims, 4 Drawing Sheets

U.S. PATENT DOCUMENTS

| | | | |
|---|---|---|---|
| 5,194,828 | A | 3/1993 | Kato et al. |
| 5,239,455 | A | 8/1993 | Fobbester et al. |
| 5,256,989 | A | 10/1993 | Parker et al. |
| 5,329,252 | A | 7/1994 | Major |
| 5,331,295 | A | 7/1994 | Jelinek et al. |
| 5,332,930 | A | 7/1994 | Volk |
| 5,343,167 | A | 8/1994 | Masumoto et al. |
| 5,357,216 | A | 10/1994 | Nguyen |
| 5,363,066 | A | 11/1994 | Chen et al. |
| 5,375,148 | A | 12/1994 | Parker et al. |
| 5,412,349 | A | 5/1995 | Young et al. |
| 5,424,689 | A | 6/1995 | Gillig et al. |
| 5,444,744 | A | 8/1995 | Yamamoto et al. |
| 5,446,867 | A | 8/1995 | Young et al. |
| 5,455,840 | A | 10/1995 | Nakauchi et al. |
| 5,457,428 | A | 10/1995 | Alder et al. |
| 5,485,125 | A | 1/1996 | Dufour |
| 5,495,207 | A | 2/1996 | Novof |
| 5,525,932 | A | 6/1996 | Kelkar et al. |
| 5,550,493 | A | 8/1996 | Miyanishi |
| 5,550,515 | A | 8/1996 | Liang et al. |
| 5,576,647 | A | 11/1996 | Sutardja et al. |
| 5,596,614 | A | 1/1997 | Ledda |
| 5,619,161 | A | 4/1997 | Novof et al. |
| 5,625,306 | A | 4/1997 | Tada |
| 5,631,591 | A | 5/1997 | Bar-Niv |
| 5,657,359 | A | 8/1997 | Sakae et al. |
| 5,663,686 | A | 9/1997 | Tada |
| 5,684,844 | A | 11/1997 | Bouzidi et al. |
| 5,699,016 | A | 12/1997 | Federspiel et al. |
| 5,703,511 | A | 12/1997 | Okamoto |
| 5,724,007 | A | 3/1998 | Mar |
| 5,734,279 | A | 3/1998 | Bereza |
| 5,736,880 | A | 4/1998 | Bruccoleri et al. |
| 5,737,589 | A | 4/1998 | Doi et al. |
| 5,740,213 | A | 4/1998 | Dreyer |
| 5,801,578 | A | 9/1998 | Bereza |
| 5,815,042 | A | 9/1998 | Chow et al. |
| 5,825,640 | A | 10/1998 | Quigley et al. |
| 5,898,336 | A * | 4/1999 | Yamaguchi ............... 327/157 |
| 5,949,264 | A | 9/1999 | Lo |
| 6,043,695 | A | 3/2000 | O'Sullivan |
| 6,067,336 | A | 5/2000 | Peng |
| 6,079,161 | A | 6/2000 | Takano et al. |
| 6,084,479 | A | 7/2000 | Duffy et al. |
| 6,172,571 | B1 | 1/2001 | Moyal et al. |
| 6,204,705 | B1 | 3/2001 | Lin |
| 6,229,345 | B1 | 5/2001 | Kirkland et al. |
| 6,242,956 | B1 | 6/2001 | McCollough et al. |
| 6,275,116 | B1 | 8/2001 | Abugharbieh et al. |
| 6,320,435 | B1 | 11/2001 | Tanimoto |
| 6,466,078 | B1 | 10/2002 | Stiff |
| 6,472,915 | B1 | 10/2002 | Moyal et al. |
| 6,954,511 | B2 | 10/2005 | Tachimori |
| 6,963,233 | B2 | 11/2005 | Puccio et al. |
| 6,980,038 | B2 | 12/2005 | Boerstler et al. |
| 7,030,688 | B2 | 4/2006 | Dosho et al. |
| 7,589,594 | B2 | 9/2009 | Liu |
| 2003/0025538 | A1 | 2/2003 | Bisanti et al. |
| 2004/0160281 | A1 | 8/2004 | McDonald, II et al. |
| 2004/0239386 | A1 | 12/2004 | Lim et al. |
| 2005/0134391 | A1 | 6/2005 | Kimura et al. |
| 2005/0280453 | A1 | 12/2005 | Hsieh |

OTHER PUBLICATIONS

Alan B. Grebene, "Bipolar and MOS Analog Integrated Circuit Design," John Wiley & Sons Inc., 1984, p. 106; 3 pages.
USPTO Notice of Allowance for U.S. Appl. No. 09/955,865 dated Jul. 1, 2002; 8 pages.
USPTO Non-Final Rejection for U.S. Appl. No. 09/955,865 dated Feb. 14, 2002; 5 pages.
USPTO Notice of Allowance for U.S. Appl. No. 09/849,164 dated Jun. 17, 2002; 5 pages.
USPTO Non-Final Rejection for U.S. Appl. No. 09/849,164 dated Dec. 19, 2001; 8 pages.
USPTO Notice of Allowance for U.S. Appl. No. 09/328,083 dated Mar. 23, 2001; 3 pages.
USPTO Final Rejection for U.S. Appl. No. 09/328,083 dated Jan. 3, 2001; 5 pages.
USPTO Non-Final Rejection for U.S. Appl. No. 09/328,083 dated Jul. 6, 2000; 4 pages.
USPTO Notice of Allowance for U.S. Appl. No. 09/275,373 dated Aug. 3, 2000; 4 pages.
USPTO Non-Final Rejection for U.S. Appl. No. 09/275,373 dated Apr. 19, 2000; 5 pages.
USPTO Final Rejection for U.S. Appl. No. 11/322,044 dated Oct. 19, 2009; 10 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
USPTO Notice of Allowance for U.S. Appl. No. 09/396,344 dated Dec. 29, 2000; 3 pages.
USPTO Non-Final Rejection for U.S. Appl. No. 09/396,344 dated Aug. 24, 2000; 8 pages.
USPTO Notice of Allowance for Application No. 08/758,529 dated Apr. 26, 1999; 2 pages.
USPTO Non-Final Rejection for Application No. 08/758,529 dated 11/0911998; 5 pages.
USPTO Non-Final Rejection for Application No. 08/758,529 dated Apr. 21, 1998; 5 pages.
USPTO Notice of Allowance for Application No. 09/086,124 dated Feb. 28, 2000; 3 pages.
USPTO Non-Final Rejection for Application No. 09/086,124 dated Sep. 13, 1999; 6 pages.
Shariatdoust et al., "A Low Jitter 5 MHz to 180 MHz Clock Synthesizer for Video Graphics," AT&T Bell Laboratories, IEEE, 1992, Custom Integrated Circuits Conference, pp. 24.2.1-24.2.5; 5 pages.
Alvarez et al., "A Wide-Bandwidth Low-Voltage PLL for PowerPC Microprocessors," Motorola, 1994, Symposium on VLSI Circuits Digest of Technical Papers, pp. 37-38; 2 pages.

* cited by examiner

CHARGE PUMP CIRCUIT AND METHOD FOR PHASE LOCKED LOOP

This application claims the benefit of U.S. Provisional Patent Application Ser. No. 60/764,589, filed on Feb. 1, 2006, the contents of which are incorporated by reference herein.

TECHNICAL FIELD

The present invention relates generally to electronic circuits, and in particular to charge pump circuits for use in phase locked loops, and the like.

BACKGROUND OF THE INVENTION

In electronic systems, good clock distribution can be very important to the overall performance of the product. Unwanted clock skew and jitter are two phenomena that may result from poor clock distribution, thus causing problems in the design and operation of the electronic system. Techniques have been developed using phase lock loops (PLLs) to successfully manage these problems and reduce both to manageable levels. However, current conventional solutions are not without some disadvantages.

Conventional PLL solutions can have certain advantages, including the fact that PLLs can suppress skew in digital systems (for example, clock to data out delay), can generate multiple phases of output clocks, and can be used to multiply or divide clock signals. In an exemplary application, a PLL may operate as a clock multiplier, where an input clock of 10 MHz may be multiplied by the PLL to yield 1000 Mhz. In an ideal embodiment, a clock multiplication function can result in an output CLK that is in perfect phase alignment with the input CLK.

A common implementation of a conventional PLL is that of a charge-pump based PLL. In this topology, a phase-frequency detector (PFD) is used to determine the relative phase and frequency of the PLL output and a reference clock input. The outputs of the PFD are coupled to a charge pump. The charge pump is used to add or subtract charge from a loop filter in response to PFD output signals by switching on or off electric currents of predetermined values for a duration determined by the PFD signals. The loop filter integrates charge from the charge pump, converting it to a voltage input to a voltage controlled oscillator (VCO). The VCO converts the voltage into the PLL output frequency. This output frequency can be connected back to the PFD input in some fashion.

Inputs received by a charge pump from a PFD can instruct a PLL to go "up" or "down" in frequency. These "up" and "down" signals have a duration that is proportional to the phase difference of the reference frequency and PLL output frequency, particularly when the two frequencies become very close. This phase difference is referred to as "phase error". When a PLL is locked in both phase and frequency, this phase error is driven to a minimum that is determined by natural mismatches in the PFD, charge pump and other PLL circuitry, along with the precision with which the up and down signals are switched. This minimum phase error is referred to as static phase error.

To better understand various features of the disclosed embodiments, a conventional charge pump will be described with reference to FIG. 6. FIG. 6 shows a conventional complementary-metal-oxide-semiconductor (CMOS) charge pump 600, constructed of both n and p-type insulated gate field effect transistors (IGFETs). Charge pump 600 can include a pump up section 602, a pump down section 604, a "source" current source 606, and a "sink" current source 608.

A pump up section 602 can include a first buffer 610, a p-type transistor P60, and n-type transistor N60. A pump up section 602 can receive an up input signal (UpM) that is applied to the input of first buffer 610 which has an output connected to the gate of a transistor P60. The up input signal (UpM) can also be applied to the gate of a transistor N60. Transistors P60 and N60 can form a stack from a higher power supply (VCC) to low power supply (VSS). A drain-drain connection of transistors P60 and N60 can form a node Node60 that is connected to source current source 606.

Referring still to FIG. 6, a pump down section 604 can include a second buffer 612, a p-type transistor P62, and n-type transistor N62. A pump down section 604 can receive a down input signal (Dn), where the down input signal is applied to the input of second buffer 612 which has an output connected to the gate of a transistor N62. The down input signal (Dn) can also be applied to the gate of transistor P62. Transistors P62 and N62 can form a second stack from a higher power supply (VCC) to a low power supply (VSS). A drain-drain connection of transistors P62 and N62 can form a node Node62 that is connected to sink current source 608.

Source current source 606 can source current (i.e., provide current) to an output node 614, while sink current source 608 can sink current (i.e., draw current) from output node 614, to thereby generate an output current Iout.

Conventional charge pump 600 can operate in the following manner: When input signal Dn is high or input signal UpM is low, current flows either to or from output node 614. More particularly, current should only flow from output node 614 to ground (when signal Dn high) or from VCC to output node 614 (when signal UpM low). Current sources (606 and 608) can be a single transistor or several transistors (e.g., a cascade configuration). A buffer (610 or 612) may operate as a delay to improve transistor switching and minimize charge injection. The upper n-type transistor N60 and lower p-type transistor P62 can be present to effect a precise turn off of charge pump 600, which can minimize PLL static phase error.

Disadvantages of the conventional solution can include that when Dn is low and UpM is high, the charge pump is ideally off. However, in a conventional case like that of FIG. 6, when the charge pump is off, a small reverse current (shown as Irev(Up) and Irev(Dn)) can flow through either of the current sources (606 and 608) depending upon the implementation of the current sources. For example, current sources in a charge pump configured as current mirrors, can be referenced to bias transistors in another portion of a PLL circuit. More particularly, a current mirror can be a transistor whose gate is set, or biased, at a voltage that is between the lowest and highest voltages available in the charge pump. Because the current mirror device can be biased at a voltage that is not equal to the minimum or maximum voltage, under certain bias conditions a reverse current (Irev(Up) or Irev(Dn)) can arise, that flows in a direction opposite to the intended direction of the current source. A reverse current can become excessive as a voltage on output node 614 approaches high or low limits (i.e., VCC or VSS). Such a reverse current can cause ripples on output node 614 as a corresponding PFD/charge pump repeatedly updates the loop filter voltage and the reverse current alternately degrades the loop filter voltage. This ripple can lead to a time varying frequency at the output of the VCO. This time varying frequency is often referred to as long-term jitter. As noted above, as an output node 614 voltage reaches the voltage extremes available to the PLL, the reverse leakage increases in magnitude. This phenomenon can limit the useful range of the voltage on the loop filter (Iout).

In addition, an unintended reverse current through current sources (such as biased current mirrors), can increase as the geometry of the devices used in such circuits decreases, as is the case in advanced manufacturing processes. This can be true even when the charge pump devices are operating in the sub-threshold region of operation. For smaller geometry devices, sub-threshold currents in the weak inversion region of operation are typically much higher. This can further reduce the usable range of loop filter voltage. Compounding this problem, small geometry processes must also be operated at lower voltage ranges in order to protect these small devices from overstress.

DETAILED DESCRIPTION

Various embodiments of the present invention will now be described in detail with reference to a number of drawings. The embodiments show charge pump circuits and methods that can greatly reduce if not essentially eliminate reverse currents through current sources.

Figure 1A:
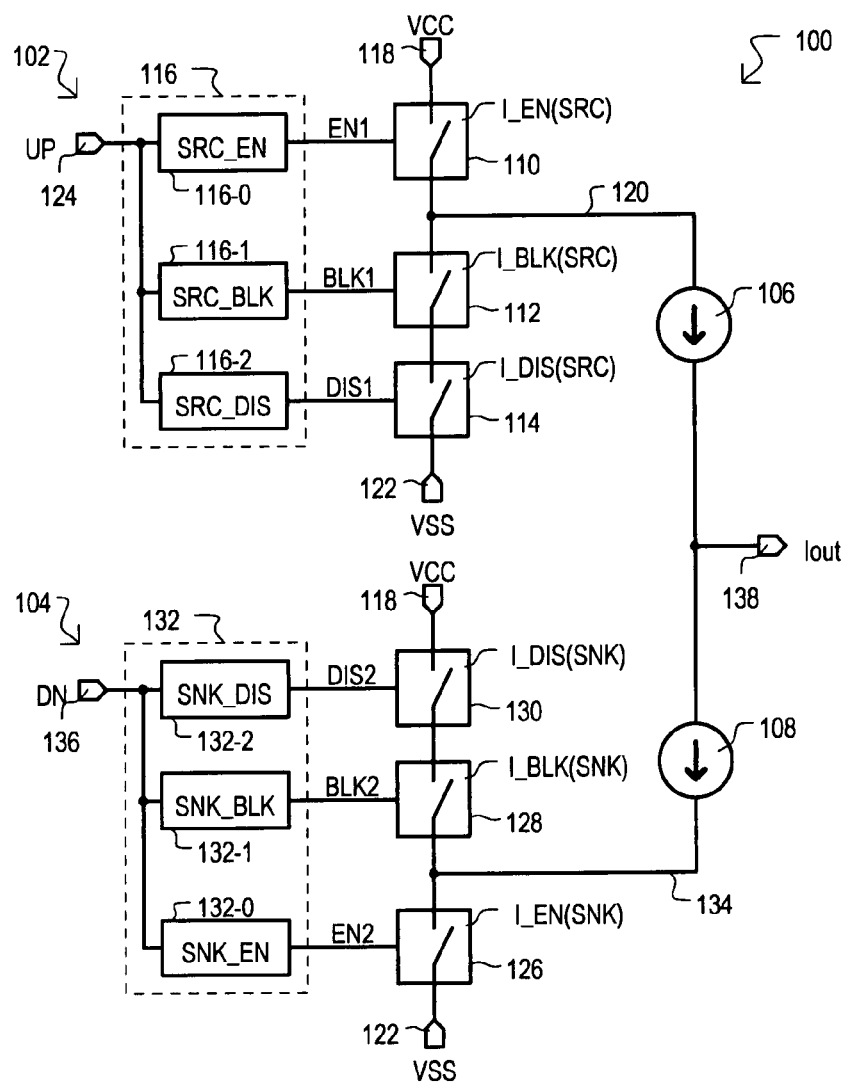
FIG. 1A is a block schematic diagram of a charge pump circuit according to a first embodiment.

A charge pump circuit according to a first embodiment is shown in a block schematic diagram in FIG. 1A and designated by the general reference character 100. A charge pump circuit 100 can include a source section 102, a sink section 104, a source current source 106, and a sink current source 108.

A source section 102 can include a source enable switch 110, a first blocking switch 112, a source disable switch 114, and a source timing circuit 116. A source enable switch 110 can include a controllable impedance path connected between a high power supply node 118 and a source output node 120 that can be enabled (e.g., provide a low impedance) or disabled (e.g., provide a high impedance), in response to a signal EN1.

A first blocking switch 112 and source disable switch 114 can be connected in series with one another between source output node 120 and a low power supply node 122. First blocking switch 112 can be enabled or disabled in response to a signal BLK1. Source disable switch 114 can be enabled or disabled in response to a signal DIS1.

A source timing circuit 116 can provide signals EN1, BLK1 and DIS1 in response to an input signal UP received at a first input node 124. A source timing circuit 116 can be conceptualized as including timing paths 116-0 to 116-2 between first input signal node 124 and source enable switch 110, first blocking switch 112, and source disable switch 114, respectively. In response to a transition in signal UP, any of switches 102, 104, 106 can be disabled or enabled.

In this way, a source section 102 can either source current to a source output node 120, or disable such a current sourcing operation.

A sink section 104 can have the same general construction as a source section 102, but with respect to a low power supply node 122. Thus, a sink section 104 can include a sink enable switch 126, a second blocking switch 128, a sink disable switch 130, and a sink timing circuit 132. A sink enable switch 126 can be connected between low power supply node 122 and a sink output node 134, and second blocking switch 128 and sink disable switch 130 can be connected in series with one another between sink output node 134 and high power supply node 118.

A sink timing circuit 132 can provide signals EN2, BLK2 and DIS2 in response to an input signal DN received at a second input node 136. Sink timing circuit 132 can be conceptualized as including timing paths 132-0 to 132-2 between second input signal node 136 and switches 126, 128 and 130. Thus, in response to a transition in signal DN, any of switches 126, 128, 130 can be disabled or enabled.

In this way, a sink section 104 can either sink current from sink output node 134, or disable such a current sinking operation.

A source current source 106 can be connected to provide a current path from source output node 120 to a control output node 138. A sink current source 108 can be connected to provide a current path from control output node 138 to sink output node 134.

Figure 1B:
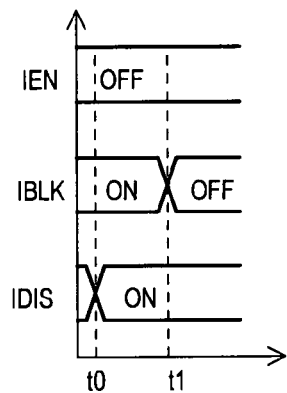
FIG. 1B is a timing diagram showing the operation of the first embodiment.

A disable operation for charge pump circuit 100 of FIG. 1A will now be described with reference to a timing diagram of FIG. 1B. FIG. 1B shows three waveforms IEN, IBLK, and IDIS. Each waveform can represent a current path provided by an enable switch, blocking switch, or disable switch, respectively. That is, in the case of source section 102, waveform IEN can correspond to the current path provided by source enable switch 110, waveform IBLK can correspond to the current path provided by first blocking switch 112, and waveform IDIS can correspond to the current path provided by source disable switch 114. In the case of sink section 104, waveform IEN can correspond to the current path provided by sink enable switch 126, waveform IBLK can correspond to the current path provided by second blocking switch 128, and waveform IDIS can correspond to the current path provided by sink disable switch 130.

Referring now to FIG. 1B, prior to time t0, an input signal (UP or DN) can transition from an active to inactive state (e.g., for UP high to low, and for DN high to low). In response to such a signal transition, an enable switch current path IEN can be disabled (e.g., either switch 110 or 126 can be turned off). In this way, an output node (120 or 134) can be isolated from its corresponding supply node (VCC or VSS).

At time t0, or thereafter, the current paths for both a blocking switch and the corresponding disable switch (IBLK and IDIS) can be enabled. Thus, in the case of a source section 102, a source output node 120 can be connected to a low power supply node 122, while in the case of sink section 104, a sink output node 134 can be connected to a high power supply node 118. In this way, an output node (i.e., 120 or 134) can be "pulsed" to a disable voltage.

At time t1, a current path for a blocking switch (IBLK) can be disabled, while a current path for the corresponding disable current path (IDIS) can remain enabled. This can result in a blocking device (i.e., 112 or 128) blocking current flow in either direction (reverse or otherwise).

Figure 6:
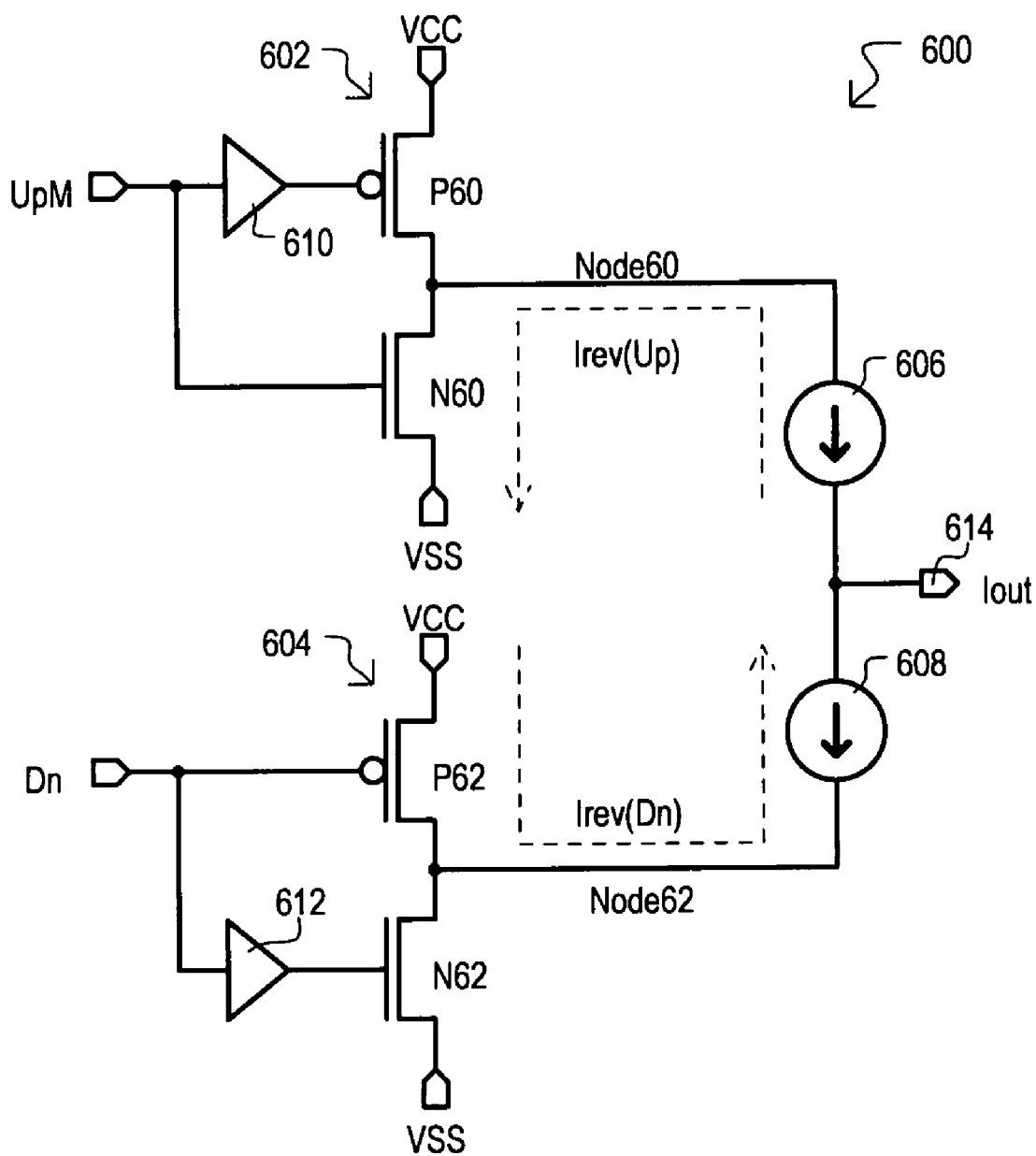
FIG. 6 is a schematic diagram of conventional charge pump circuit.

Note that unlike a conventional case, like that of FIG. 6, because a blocking current path is disabled, the potential for any reverse current path is substantially reduced or eliminated. For example, in the case of source section 102, first blocking switch 112 can prevent a current flow from reference output node 138, through sink current source 106 and from source output node 120 to low power supply node 122. In the case of sink section 104, second blocking switch 128 can prevent current flow from a high power supply node 118, through sink output node 134 and through sink current source 108 to reference output node 138.

In this way, a charge pump circuit can prevent a reverse current through current source and sink paths when such paths are disabled.

Figure 2:
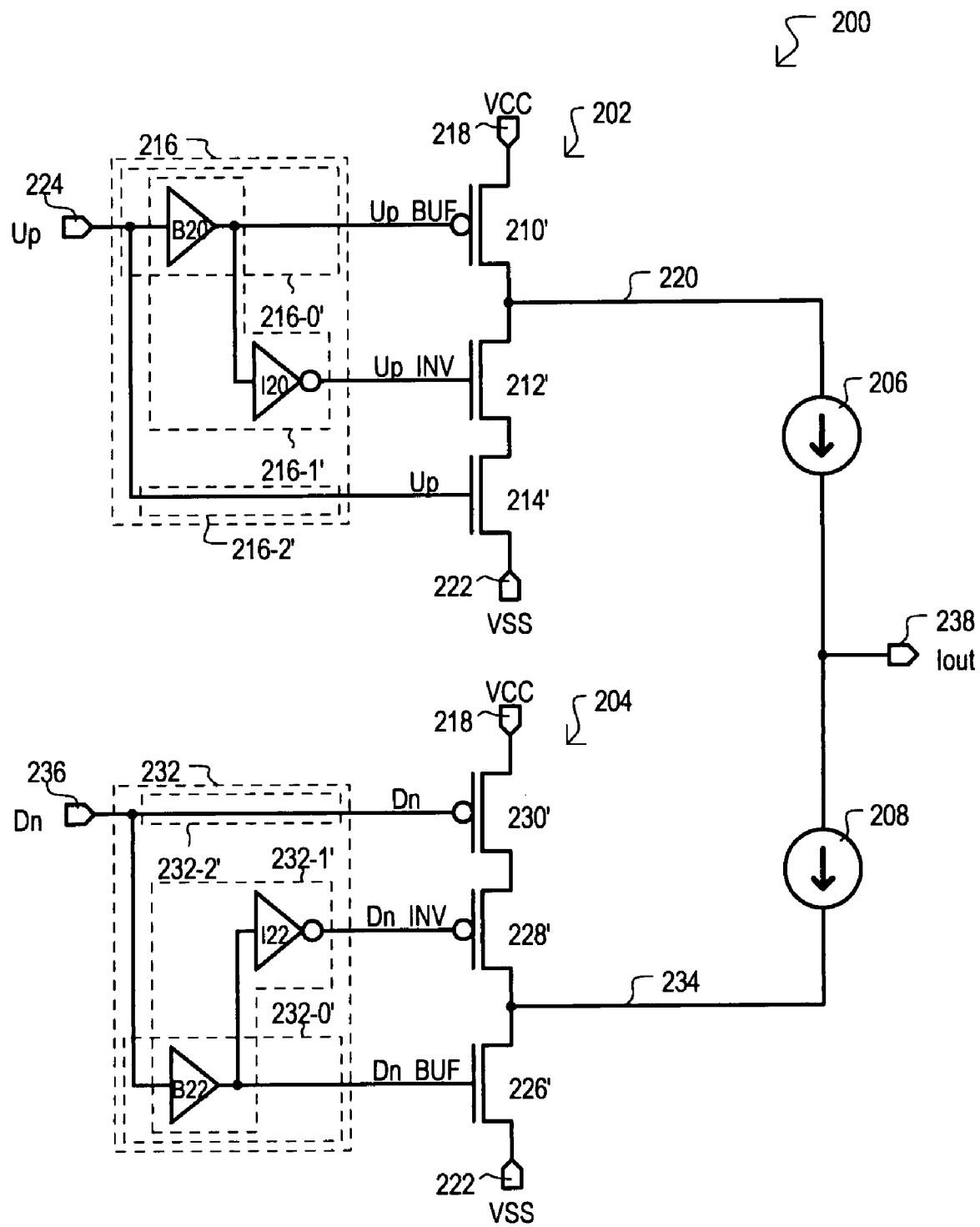
FIG. 2 is a schematic diagram of a charge pump circuit according to a second embodiment.

Referring now to FIG. 2, a charge pump circuit according to a second embodiment is shown in a schematic diagram, and designated by the general reference character 200. A charge pump circuit 200 can have the same general components as that shown in FIG. 1A, thus like sections are referred to by the same reference character but with the first digit being a "2" instead of a "1".

In the particular arrangement of FIG. 2, a source enable switch 210', a second disable switch 228', and a sink disable switch 230' can be p-channel insulated gate field effect transistors (IGFETs). In addition, a first disable switch 212', source disable switch 214', and sink enable switch 226' can be n-channel IGFETs. The current path for each transistor can be its source-drain path.

FIG. 2 also shows particular examples of a source timing circuit 216 and a sink timing circuit 232. A source timing circuit 216 can include a first buffer B20 and a first inverter I20. In such an arrangement, a first timing path 216-0' can include buffer B20, a second timing path 216-1' can include buffer B20 and inverter I20, and a third timing path 216-2' can include a wiring path. An input signal Up can be connected to an input of first buffer B20. An output of first buffer B20 can be connected to an input of first inverter INV20, and to a gate of a p-channel transistor 210'. The output of first inverter INV20 can be connected to a gate of n-channel transistor 212'. An input signal Up can be further connected to a gate of n-channel transistor 214'. Transistors 210', 212' and 214' can form a stack from a high power supply (VCC) to a low power supply (VSS). Source output node 220 between transistors 210' and 212' can be connected to source current source 206.

Like the source timing circuit 216, a sink timing circuit 232 can include a second buffer B22 and a second inverter I22. In such an arrangement, a first timing path 232-0' can include buffer B22, a second timing path 232-1' can include buffer B22 and inverter I22, and a third timing path 232-2' can include a wiring path. An input signal Dn can be connected to an input of second buffer B22. An output of second buffer B22 can be connected to an input of second inverter INV22 and to a gate of n-channel transistor 226'. The output of second inverter INV22 can be connected to a gate of p-channel transistor 228'. An input signal Dn can be further connected to a gate of p-channel transistor 230'. Transistors 226', 228' and 230' can form another stack from a high power supply (VCC) to a low power supply (VSS). Sink output node 234 between transistors 228' and 226' can be connected to sink current source 208.

The embodiment of FIG. 2 can operate in the following manner: After one section of the charge pump circuit 200 has been switched off (e.g., after Dn has gone low, or Up has gone high) it is no longer desirable to maintain a current path between transistors 212'/214' or 228'/230' that can result in a reverse current. The embodiment of FIG. 2 can detect those edges of the input signals (Dn or Up) that turn off their respective section of the charge pump 200. Once such an edge has been detected, a reverse current path in the section can be disabled after a small time delay. The time delay allows for a quick turn off of the active current, maintaining the desired low static phase error attribute of the charge pump, but limiting the time that reverse current can be drawn (and thus degrade the voltage at a loop filter in a PLL application). In addition, turning off blocking transistors (212' or 228') can also eliminate the reverse current leakage path due to the current mirror devices being in weak inversion.

Figure 3:
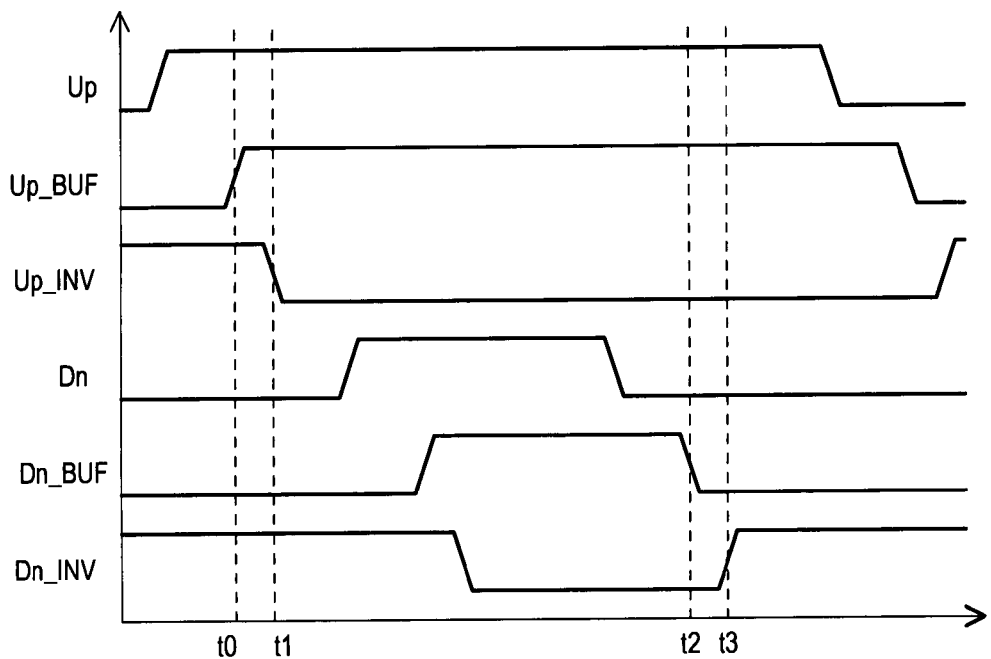
FIG. 3 is a timing diagram showing signals of the embodiment of FIG. 2.

Selected operations of the circuit 200 will now be described with reference to FIGS. 2 and 3. FIG. 3 is a timing diagram showing the generation of various signals in control sections 216 and 232. Included in FIG. 3 are waveforms for a first control signal Up received at a first input signal node 224, a buffered signal Up_BUF output by first buffer B20, and an inverter signal Up_INV output by first inverter I20. Also shown is a second control signal Dn received at second input signal node 236, a buffered signal Dn_BUF output by second buffer B22, and an inverter signal Dn_INV output by second inverter I22.

First, a circuit 200 can generate a pulse on a deactivating edge of an input signal (Up or Dn) by applying normal and time delayed inverted signals to series connected transistors (212'/214' or 228'/230'). In particular, at time t0, signals Up_BUF and Up_INV can both be high, pulsing source output node 210 to a low power supply level (VSS). Also, at time t2, signals Dn_BUF and Dn_INV can both be low, pulsing sink output node 234 to a high power supply level (VCC). Activating edges/levels of input signals Up and Dn can remain unchanged, as compared to conventional approaches.

Second, such a pulse generation circuit maintains proper timing during switching (Up and Dn charge/discharge correctly and charge injection minimized).

Third, signals Up and Dn can cause a tri-stating when the charge pump circuit is off (after a short delay). In particular, at time t1, signal Up_INV can transition low, turning off transistor 212'. Also, at time t3, signal Dn_INV can transition high, turning off transistor 228'. Such a turning off of these transistors can result in the essential elimination of reverse current paths, extending the operating range of voltage on a control output node 238. This can offer a significant advantage as manufacturing processes scale to lower operating voltages and smaller device sizes, which can lead to higher leakage in devices.

It is understood that the particular timing arrangement of FIG. 3 represents but one way of generating a pulse and disabling reverse leakage paths. However, the embodiment of FIG. 2 is advantageously compact, adding only two inverters and blocking transistors over the conventional circuit of FIG. 6. Consequently, the critical timing of enabling and disabling the current sources is not impacted and charge injection leading to static phase error can be prevented from being worse. The power consumption of the extra circuitry can be a minimal increase over the conventional approach.

However, alternate embodiments can include different timing arrangements.

While the embodiments have shown charge pump circuits, other embodiments can include such charge pump circuits included in larger circuits for advantageous performance. One particular example of such an embodiment is shown in FIG. 4.

Figure 4:
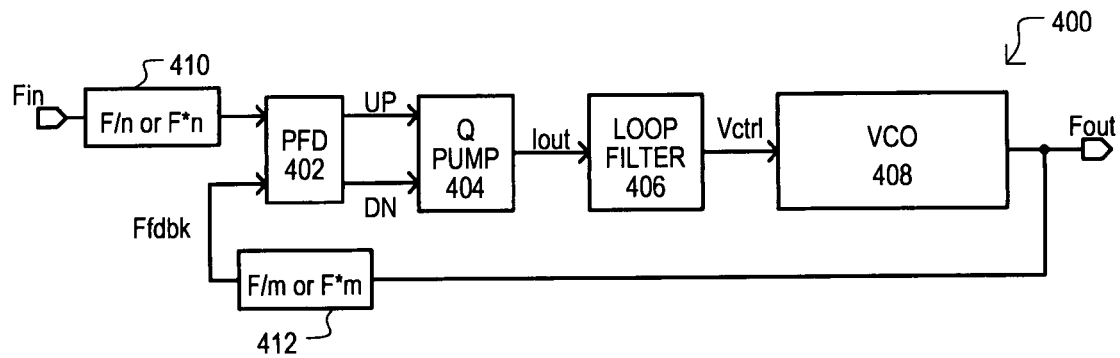
FIG. 4 is a block schematic diagram of phase lock loop (PLL) circuit according to one embodiment.

FIG. 4 shows an example of a phase locked loop (PLL) circuit in a block schematic diagram, designated by the general reference character 400. A PLL circuit can include a phase frequency detector (PFD) 402, a charge pump 404, a loop filter 406, and a voltage controlled oscillator (VCO) 408. A PLL circuit 400 can optionally include an input multiplier/divider 410 and/or a feedback multiplier/divider 412.

A PFD 402 can be a conventional circuit designed to generate two control signals (UP and DN) for indicating a difference in phase/frequency between an input signal Fin and a feedback signal Ffdbk. A charge pump 404 can take the form of any of the above embodiments, or equivalents, and can source current to, sink current from, or provide a high impedance (i.e., little or no reverse current) at output node Iout. A loop filter 406 can provide a control voltage Vctrl based on currents (e.g., either sourced or sunk) provided by charge pump 404. A VCO 408 can provide an output signal Fout that oscillates at a frequency according to control voltage Vctrl.

An input frequency multiplier/divider 410 can be provided to frequency multiply or divide an input signal Fin. Similarly, a feedback multiplier/divider 412 can frequency multiple or divide an output signal Fout to generate a feedback signal Ffdbk. Of course, such multiplier/dividers are optional depending upon application.

In this way, a PLL can include a charge pump circuit that has little or no reverse current draw, thus providing a wider usable control voltage range and reduction in long term jitter.

Figure 5:
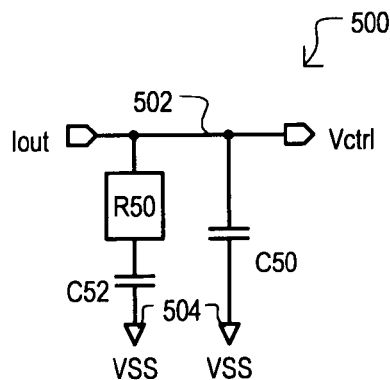
FIG. 5 is a schematic diagram showing a loop filter according to an embodiment.

Referring now to FIG. 5, one particular example of a loop filter is shown in a schematic diagram and designated by the general reference character 500. A loop filter 500 can include one or more capacitors that can be charged/discharged according to sourced/sunk currents. In the particular example of FIG. 5, a loop filter can include a first capacitor C50 connected between a control node 502 and a low power supply node 504, as well as a second capacitor C52 in series with a resistor R50 between control node 502 and a lower power supply node 504.

Of course, a PLL circuit could include other types of loop filters.

Advantages of the various embodiments can be that a reverse current path for a charge pump, like that shown in FIG. 6, can be significantly reduced if not eliminated. As a result, an operating range of voltage on a control node can be extended, and the embodiments can be used with transistors prone to leakage.

While the above embodiments have shown arrangements that might imply a single ended architecture (e.g., single ended PLL), the present invention can be included in differential architectures.

Of course, embodiments can include any combination of the individually mentioned circuits, whether combining all elements or only some, not limited to any specific combination or set of combinations. For example, it may be possible to have more than one PFD. In addition, a pre-charge circuit can be included, or a PLL can have a second VCO. It is also possible to use a lock detector to power down the fast lock circuitry once phase lock has been achieved. Further, other embodiments can include a phase detector in lieu of a PFD.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved solution and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A charge pump circuit, comprising:
a pump-up circuit comprising a first switch coupled between a pump-up output node and a first power supply node that is controlled by a first control signal, and a source off path coupled between the pump-up output node and a second power supply node that is controlled by second and third control signals, wherein the first switch is configured to be on when the source off path is configured to be a high impedance path, and the source off path is configured to be a low impedance path for a first duration and a high impedance path for a second duration when the first switch is configured to be off; and
a pump-down circuit comprising a second switch coupled between a pump-down output node and the second power supply node that is controlled by a fourth control signal, and a sink off path coupled between the pump-down output node and the first power supply node that is controlled by fifth and sixth control signals, wherein the second switch is configured to be on when the sink off path is configured to be a high impedance path, and the sink off path is configured to be a low impedance path for a third duration and a high impedance path for a fourth duration when the second switch is controlled to be off.

2. The charge pump circuit of claim 1, wherein:
the pump-up circuit comprises a plurality of transistors having controllable impedance paths arranged in series with one another.

3. The charge pump circuit of claim 2, wherein:
the plurality of transistors includes at least three transistors and the first switch comprises a second of the transistors in the series connection.

4. The charge pump circuit of claim 1, wherein:
the pump-down circuit comprises a plurality of transistors having controllable impedance paths arranged in series with one another.

5. The charge pump circuit of claim 4, wherein:
the plurality of transistors includes at least three transistors and the second switch comprises a second of the transistors in the series connection.

6. The charge pump circuit of claim 1, wherein the pump-up circuit further comprises a first input signal node coupled to the first control signal, wherein the second signal path is coupled between the first input signal node and the first switch.

7. The charge pump circuit of claim 6, wherein:
the first control signal comprises a buffer circuit, and the second and third signals comprise the buffer circuit and an inverter having an input coupled to the output of the buffer circuit.

8. The charge pump circuit of claim 6, wherein:
the first control signal is coupled between the first input signal node and a source current path switch coupled between the pump-up output node and the second power supply node.

9. The charge pump circuit of claim 1, further including:
a first current source coupled between the pump-up output node and a current output node; and
a second current source coupled between the pump-down output node and the current output node.

10. The charge pump circuit of claim 1, wherein:
the pump-down circuit further comprises,
a second input signal node,
a fourth signal coupled to the second input signal node, and
a fifth and sixth control signal coupled between the second input signal node and the second switch that has a greater signal delay than the fourth signal path.

11. A charge pump circuit, comprising:
a first supply enable switch coupled between a first power supply node and a first current output node, wherein the first supply enable switch is configured to shunt current from the first current output node to the first power supply node;
a first supply disable switch coupled between the first current output node and a second power supply node;
a first current blocking switch coupled in series between the first supply disable switch and the first supply enable switch, wherein the first current blocking switch and the first supply disable switch are coupled to shunt current from the first current output node to the second power supply node subsequent to current being shunted to the first power supply node and to set the first current output node to high impedance subsequent to current being shunted to the second power supply; and
a first control circuit that includes a first signal path coupled between the first current blocking switch and a first input node and having a delay greater than a second signal path coupled between the first supply disable switch and the first input node.

12. The charge pump circuit of claim 11, wherein:
the first supply enable switch, the first supply disable switch, and the first current blocking switch each comprise an insulated gate field effect transistor (IGFET).

13. The charge pump circuit of claim 12, wherein:
the first supply enable switch comprises an IGFET of a first conductivity type, and the first supply disable switch and first current blocking switch comprise IGFETs of a second conductivity type.

14. The charge pump circuit of claim 11, further including:
a second supply enable switch coupled between the second power supply node and a second current output node, wherein the second supply enable switch is configured to shunt current from the second current output node to the second power supply node;
a second supply disable switch coupled between the second current output node and the first power supply node;
a second current blocking switch coupled in series with the second supply disable switch, wherein the second current blocking switch and the second supply disable switch are coupled to shunt current from the second current output node to the first power supply node subsequent to current being shunted to the second power supply node and to set the second current output node to high impedance subsequent to current being shunted to the first power supply; and
a second control circuit that includes a third signal path coupled between the second current blocking switch and a second input node having a delay greater than a fourth signal path coupled between the second supply disable switch and the second input node.

15. The circuit of claim 14, further including:
a first current source circuit that sources current from the first current output node to a control node; and
a second current source circuit that sinks current from the control node to the second current output node.

16. The circuit of claim 15, further including:
a loop filter that generates a control voltage in response to current sourced and sunk at the control node, the loop filter including at least one capacitor coupled between the control node and the second power supply node.

17. The circuit of claim 16, further including:
a voltage controlled oscillator coupled to the loop filter that generates an oscillating signal having a frequency controlled in response to the control voltage.

18. A method of stabilizing a charge pump output current, comprising the steps of:
in response to a first pump signal transitioning from an active state to an inactive state,
disabling a current source switch coupled between a first power supply node and a first current output node,
enabling a first current blocking switch and a first current disable switch coupled in series with one another between the first current output node and a second power supply node, and
after disabling the current source switch and enabling the first current blocking switch and first current disable switch, disabling the first current blocking switch while maintaining the first current disable switch in the enabled state.

19. The method of claim 18, further including:
in response to a second pump signal transitioning from an active state to an inactive state,
disabling a current sink switch coupled between the second power supply node and a second current output node,
enabling a second current blocking switch and a second current disable switch coupled in series with one another between the second current output node and the first power supply node, and
after disabling the current sink switch and enabling the second current blocking switch and second current disable switch, disabling the second current blocking switch while maintaining the second current disable switch in the enabled state.

20. The method of claim 19, wherein:
in response to the first pump signal transitioning from an inactive state to an active state,
enabling the current source switch and disabling the first current disable switch, and
after enabling the current source switch, enabling the first current blocking switch.

* * * * *